(12) United States Patent
Li

(10) Patent No.: US 7,040,902 B2
(45) Date of Patent: May 9, 2006

(54) ELECTRICAL CONTACT

(75) Inventor: Che-Yu Li, Roslyn, NY (US)

(73) Assignee: Che-Yu Li & Company, LLC, Ithaca, NY (US)

( * ) Notice: Subject to any disclaimer, the term of this patent is extended or adjusted under 35 U.S.C. 154(b) by 0 days.

(21) Appl. No.: 10/736,280

(22) Filed: Dec. 15, 2003

(65) Prior Publication Data

US 2004/0192080 A1 Sep. 30, 2004

Related U.S. Application Data

(60) Provisional application No. 60/457,258, filed on Mar. 25, 2003, provisional application No. 60/457,076, filed on Mar. 24, 2003, provisional application No. 60/462,143, filed on Apr. 8, 2003.

(51) Int. Cl.
*H01R 12/00* (2006.01)

(52) U.S. Cl. .......................... 439/66; 439/591

(58) Field of Classification Search .................. 439/66, 439/402, 91, 591, 71; 29/825, 446, 599, 29/628, 830, 874, 976, 878, 879, 884
See application file for complete search history.

(56) References Cited

U.S. PATENT DOCUMENTS

| | | | |
|---|---|---|---|
| 2,153,177 A | | 4/1939 | Ecker |
| 3,317,885 A | | 5/1967 | Yost |
| 3,354,260 A | | 11/1967 | Brandt et al. |
| 3,452,149 A | | 6/1969 | Rinaldi |
| 3,513,434 A | | 5/1970 | Zielke |
| 3,639,978 A | * | 2/1972 | Schurman ..................... 29/837 |
| 3,686,926 A | * | 8/1972 | Miller et al. ............... 73/61.72 |
| 3,711,627 A | | 1/1973 | Maringulov |
| 3,790,918 A | * | 2/1974 | Dauser ........................ 439/402 |
| 3,795,884 A | | 3/1974 | Kotaka |

(Continued)

OTHER PUBLICATIONS

Internet page of delphion.com; IBM Technical Disclosure Bulletin; *Elastomeric Material;* Sep. 1982; pp1801-1802.

(Continued)

*Primary Examiner*—Gary V. Paumen
*Assistant Examiner*—Edwin A. Leon
(74) *Attorney, Agent, or Firm*—Duane Morris LLP

(57) ABSTRACT

An electrical contact formed from a plurality of interlaced and annealed wires by weaving or braiding the wires together to form a mesh, annealing the mesh, and cutting the annealed mesh so as to form a plurality of individual electrical contacts. A method for forming a precursor material for use in manufacturing an electrical contact is also provided that includes manipulating a plurality of wires so as to interlace the wires into a unitary structure. The unitary structure is then annealed. An electrical contact may then be formed from the precursor material by elastically rolling a portion of the unitary structure so as to form a tube, annealing the tube, and then cutting the unitary structure so as to release the tube thereby to form an electrical contact. An electrical contact may also be formed by folding a portion of the unitary structure so as to form one or more pleats, annealing the pleated unitary structure, and then cutting the pleated unitary structure so as to release one or more electrical contacts. The precursor material may also be formed by photo-etching a sheet of conductive material so as to form a mesh, and then annealing the mesh. A connector system may be formed including a housing defining a plurality of openings that are each filled with an electrical contact comprising a plurality of interlaced and annealed wires that have been previously either rolled or pleated.

6 Claims, 12 Drawing Sheets

U.S. PATENT DOCUMENTS

| | | | |
|---|---|---|---|
| 3,800,378 | A | 4/1974 | Lee et al. |
| 3,954,572 | A * | 5/1976 | Ziegler et al. ............... 205/51 |
| 4,029,375 | A | 6/1977 | Gabrielian |
| 4,242,789 | A * | 1/1981 | Fox ............................ 29/446 |
| 4,781,640 | A * | 11/1988 | Tornoe et al. ............... 445/50 |
| 4,810,213 | A | 3/1989 | Chabot |
| 4,820,376 | A | 4/1989 | Lambert et al. |
| 4,838,815 | A | 6/1989 | Tajima et al. |
| 4,922,376 | A | 5/1990 | Pommer et al. |
| 5,030,109 | A | 7/1991 | Dery |
| 5,061,191 | A | 10/1991 | Casciotti et al. |
| 5,101,553 | A | 4/1992 | Carey |
| 5,127,837 | A | 7/1992 | Shah et al. |
| 5,176,535 | A | 1/1993 | Redmond et al. |
| 5,215,472 | A | 6/1993 | DelPrete et al. |
| 5,228,861 | A | 7/1993 | Grabbe |
| 5,232,372 | A | 8/1993 | Bradley et al. |
| 5,308,252 | A | 5/1994 | Mroczkowski et al. |
| 5,350,308 | A | 9/1994 | Laska et al. |
| 5,385,477 | A | 1/1995 | Vaynkof et al. |
| 5,403,194 | A | 4/1995 | Yamazaki |
| 5,427,535 | A | 6/1995 | Sinclair |
| 5,441,690 | A | 8/1995 | Ayala-Esquilin et al. |
| 5,473,510 | A | 12/1995 | Dozier, II |
| 5,495,397 | A | 2/1996 | Davidson et al. |
| 5,599,193 | A | 2/1997 | Crotzer |
| 5,653,598 | A | 8/1997 | Grabbe |
| 5,791,914 | A | 8/1998 | Loranger et al. |
| 5,800,184 | A | 9/1998 | Lopergolo et al. |
| 5,806,181 | A | 9/1998 | Khandros et al. |
| 5,810,607 | A | 9/1998 | Shih et al. |
| 5,817,986 | A | 10/1998 | Davidson et al. |
| 5,823,792 | A | 10/1998 | Regnier |
| 5,833,471 | A | 11/1998 | Selna |
| 5,949,029 | A | 9/1999 | Crotzer et al. |
| 6,074,219 | A | 6/2000 | Tustaniwskyj et al. |
| 6,142,789 | A | 11/2000 | Nolan et al. |
| 6,247,938 | B1 | 6/2001 | Rathburn |
| 6,264,476 | B1 | 7/2001 | Li et al. |
| 6,298,551 | B1 | 10/2001 | Wojnarowski et al. |
| 6,312,266 | B1 | 11/2001 | Fan et al. |
| 6,328,080 | B1 | 12/2001 | Winters |
| 6,471,554 | B1 | 10/2002 | Armistead et al. |
| 6,663,399 | B1 | 12/2003 | Ali et al. |
| 6,695,623 | B1 | 2/2004 | Brodsky et al. |
| 6,712,620 | B1 | 3/2004 | Li et al. |
| 2001/0024735 | A1 | 9/2001 | Kuhlmann-Wilsdorf et al. |
| 2002/0106913 | A1 | 8/2002 | Schuenemann et al. |
| 2003/0049974 | A1 | 3/2003 | Bauer et al. |
| 2003/0073329 | A1 | 4/2003 | Beaman et al. |
| 2003/0134525 | A1 | 7/2003 | Sweetland et al. |
| 2003/0176083 | A1 | 9/2003 | Li et al. |
| 2003/0207608 | A1 | 11/2003 | Weiss |
| 2004/0053519 | A1 | 3/2004 | Li et al. |

OTHER PUBLICATIONS

Internet page of delphion.com; IBM Technical Disclosure Bulletin; *Interposer Carrier,* Jan. 1987; pp3678-3680.

Internet page of delphion.com; IBM Technical Disclosure Bulletin; Nov. 1988; pp17-19.

Internet page of delphion.com; IBM Technical Disclosure Bulletin; *Scheme;* Oct. 1990; pp394-395.

Internet page of delphion.com; IBM Technical Disclosure Bulletin; Apr. 1991; Pub. No. 324.

Internet page of delphion.com; IBM Technical Disclosure Bulletin; *Passive Interposer Connection Scheme;* May 1993; pp249-252.

Internet page of delphion.com; IBM Technical Disclosure Bulletin; *Special Thermal Conductive Interposers;* Sep. 1993; pp7-8.

Internet page of delphion.com; IBM Technical Disclosure Bulletin; *Customable Multi-Contact-Point Interposer;* Apr. 1994, pp105-106.

Internet page of delphion.com; IBM Technical Disclosure Bulletin; *Interposer Carrier;*Jan. 1987; pp3678-2680.

Internet page of delphion.com; IBM Technical Disclosure Bulletin; *Improved Interconnection Structure;* Nov. 1988; pp17-19.

Internet page of delphion.com; IBM Technical Disclosure Bulletin, *Special Thermal Conductive Interposers,* Sep. 1993.

Internet page of delphion.com; IBM Technical Disclosure Bulletin; *High Density Area Array Connector;* Apr. 1991; Pub. No. 324.

Solid State Technology; *Integrating Backend Processes;* Feb. 2001; pp78-85.

HCD, Inc.; *Two Fundamental Approaches to Enabling High Performance LGA Connections;* pp508-514.

HDC, Inc.; *An Adaptable, High Performance LGA Connector Technology.*

Internet page of Tecknit Interconnection Products; *Standard Fuzz Button Contacts.*

Internet page of Tecknit Interconnection Products; *Fuzz Button Contacts.*

Internet page of Cinch; *High-Speed Interconnect Technology.*

Internet page of COSMOS; *COSMOS helps analyze circuit board connectors.*

HDC, Inc.; *SuperButton Land Grid Array (LGA) Connectors;* Jun. 2003.

Internet page of Design News.com; *PC-nonlinear FEA makes the connection;* John Lewis; Sep. 18, 2000.

*A High Density Ian Grid Array Connector for MCM's;* M. E. St. Lawrence and S. S. Simpson pp1491-1511.

International Symposium on Microelectronics; *Z-Axis Interconnection for 3-D High Density Packaging;* S. Spiesshoefer et al.; pp167-171.

HDC; *Corporate Overview;* Jun. 2003.

*A novel Elastomeric Connector for Packaging Interconnections, Testing and burn-in Applications;* D. Y. Ehih et al.

*Button Contacts for liquid Nitrogen Applications;* Frank Almquist.

* cited by examiner

ELECTRICAL CONTACT

CROSS-REFERENCE TO RELATED APPLICATIONS

This application claims the benefit of U.S. Provisional Patent Application No. 60/457,076, filed Mar. 24, 2003, U.S. Provisional Patent Application No. 60/457,258, filed Mar. 25, 2003, and U.S. Provisional Patent Application No. 60/462,143, filed Apr. 8, 2003.

FIELD OF THE INVENTION

The present invention generally relates to electrical interconnection devices, and more particularly to electrical contacts that are at the interface between a first electronic device and a substrate or between an electrical connector and the same.

BACKGROUND OF THE INVENTION

High density integrated circuit (IC) packages that house LSI/VLSI type semiconductor devices are well known. Input/output pins for such IC packages are often arranged in such a dense pattern (sometimes more than two hundred closely spaced contacts) that direct soldering of the IC package to a substrate, such as a printed wiring or circuit board (PCB) creates several significant problems related to inspection and correction of any resulting soldering faults. Land grid array (LGA) connectors are known for interconnecting IC packages to PCB's. LGA's typically do not require soldering procedures during engagement with the PCB. Referring to FIG. 1, prior art LGA assemblies are used to interconnect an IC package A having a plurality of flat contact pads or solder bumps B formed on a bottom surface, to contact pads C arranged in a regular pattern on a surface of PCB D.

Prior art LGA assemblies are known which include an insulative housing E and a plurality of resilient conductive contacts F received in passageways formed in housing E. Resilient conductive contacts F typically have exposed portions at the upper and lower surfaces of insulative housing E for engaging flat contact pads B,C. When IC package A is accurately positioned in overlying aligned engagement with PCB D, such that conductive pads B engage conductive pads C, a normal force is applied to the exposed portions of each resilient conductive contact F to electrically and mechanically engage the respective contact pads B,C.

The resilient conductive contacts associated with prior art LGA's have had a variety of shapes. A commonly used form of resilient conductive contact includes two free ends connected by a curved, resilient portion which provides for the storage of elastic energy during engagement with the IC package and PCB. Prior art resilient conductive contacts may be a single metal structure in the form of a spring to provide the required elastic response during service while also serving as a conductive element for electrical connection. Alternatively, contact buttons have been developed in which a connector is wound around, embedded, or otherwise engaged with a dielectric core, which often provides for elastic energy storage during operation with the conductor merely providing an electrical conduction pathway. Typically, a combination of barrier metal and noble metal platings are applied to the surface of the spring for corrosion prevention and for electrical contact enhancement. It is often the case that these platings are not of sufficient thickness for electrical conduction along only the surface of the spring. Examples of such prior art resilient conductive contacts may be found in U.S. Pat. Nos. 2,153,177; 3,317,885; 3,513,434; 3,795,884; 4,029,375; 4,810,213; 4,820,376; 4,838,815; 4,922,376; 5,030,109; 5,061,191; 5,101,553; 5,127,837; 5,215,472; 5,228,861; 5,232,372; 5,308,252; 5,350,308; 5,385,477; 5,403,194; 5,427,535; 5,441,690; 5,473,510; 5,495,397; 5,599,193; 5,653,598; 5,791,914; 5,800,184; 5,806,181; 5,810,607; 5,817,986; 5,823,792; 5,833,471; 5,949,029; 6,074,219; and 6,264,476. The foregoing patents are hereby incorporated herein by reference.

One problem in the art exists in that a good material for the construction of a spring, such as a high strength steel, is not a very good electrical conductor. On the other hand, a good electrical conductor, such as a copper alloy or precious metal, often does not provide adequate spring properties. There is a need for a more resilient conductive contact which incorporates the seemingly opposing requirements of good spring properties, temperature resistance, and high conductivity, but without the need for any integral supporting structure. Therefore, an improved electrical contact for use in an LGA socket or electrical connector is needed which can overcome the drawbacks of conventional electrical contacts.

Thus, it is desirable that a good electrical contact element possesses the following attributes: (a) usable for both a production socket, as well as, test and burn-in sockets, where the latter use requires high durability; (b) a large elastic compliance range and low contact forces; (c) capable of transmitting high frequency signals and high currents; (d) capable of withstanding high operating temperatures; and (e) exhibiting high durability, i.e. >500K repeated deflections The prior art has been devoid of at least one of the foregoing attributes necessary for a universally applicable electrical contact.

SUMMARY OF THE INVENTION

The present invention provides an electrical contact formed from a precursor material, such as an etched or stamped metal sheet, or a plurality of interlaced metal wires. The precursor materials may be formed into a tube or other appropriate shape, and annealed to set their structural form. The annealed structure may then be cut into short segments to form a plurality of individual electrical contacts. The precursor materials are often formed by photo-etching a sheet of conductive material into a mesh with openings of predetermined size and shape. The mesh may also be made by stamping with a conventional metal working die. Alternatively, the precursor material may be made by manipulating a plurality of wires so as to interlace the wires into a unitary structure in the form of a mesh. The desired form factor of the electrical contact can be made by first rolling a portion of the precursor material into a tube and followed by annealing under a constraint to set the form factor permanently. The tubular structure is then cut into short segments to form individual electrical contacts. The preferred structural forms include folded structures of one or more pleats formed from the precursor material. Such a structure can be made by pressing a unitary mesh structure in a die adapted to form pleated or folded structure in the mesh, followed by annealing the pleated or folded mesh while resident in the die to set permanently the structural form. It is then cut to form individual electrical contacts.

In one embodiment, the present invention provides an electrical contact formed from a plurality of interlaced and annealed wires. The electrical contact is often formed by weaving or braiding a plurality of wires together to form a mesh, annealing the mesh, and cutting the annealed mesh so as to form a plurality of individual electrical contacts that each have an extended elastic range as a result of the annealing process.

A method for forming a precursor material for use in manufacturing an electrical contact is also provided that includes manipulating a plurality of wires so as to interlace the wires into a unitary structure. The unitary structure is then annealed. An electrical contact may then be formed from the precursor material by rolling a portion of the unitary structure so as to form a tube, annealing the rolled unitary structure, and then cutting the unitary structure so as to release the tube thereby to form an electrical contact. An electrical contact may also be formed by folding a portion of the unitary structure so as to form one or more pleats, annealing the folded unitary structure, and then cutting the pleated unitary structure so as to release one or more electrical contacts. The precursor material may also be formed by photo-etching a sheet of conductive material so as to form a mesh, and then annealing the mesh.

A connector system may be formed in accordance with the invention including a housing defining a plurality of openings that are each filled with an electrical contact of the present invention. In one embodiment, a connector system may be formed including a housing defining a plurality of openings that are each filled with an electrical contact comprising a plurality of interlaced and annealed wires. The connector system may also include electrical contacts comprising a plurality of interlaced and annealed wires arranged in a unitary mesh having at least one pleat.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENT

Figure 1:
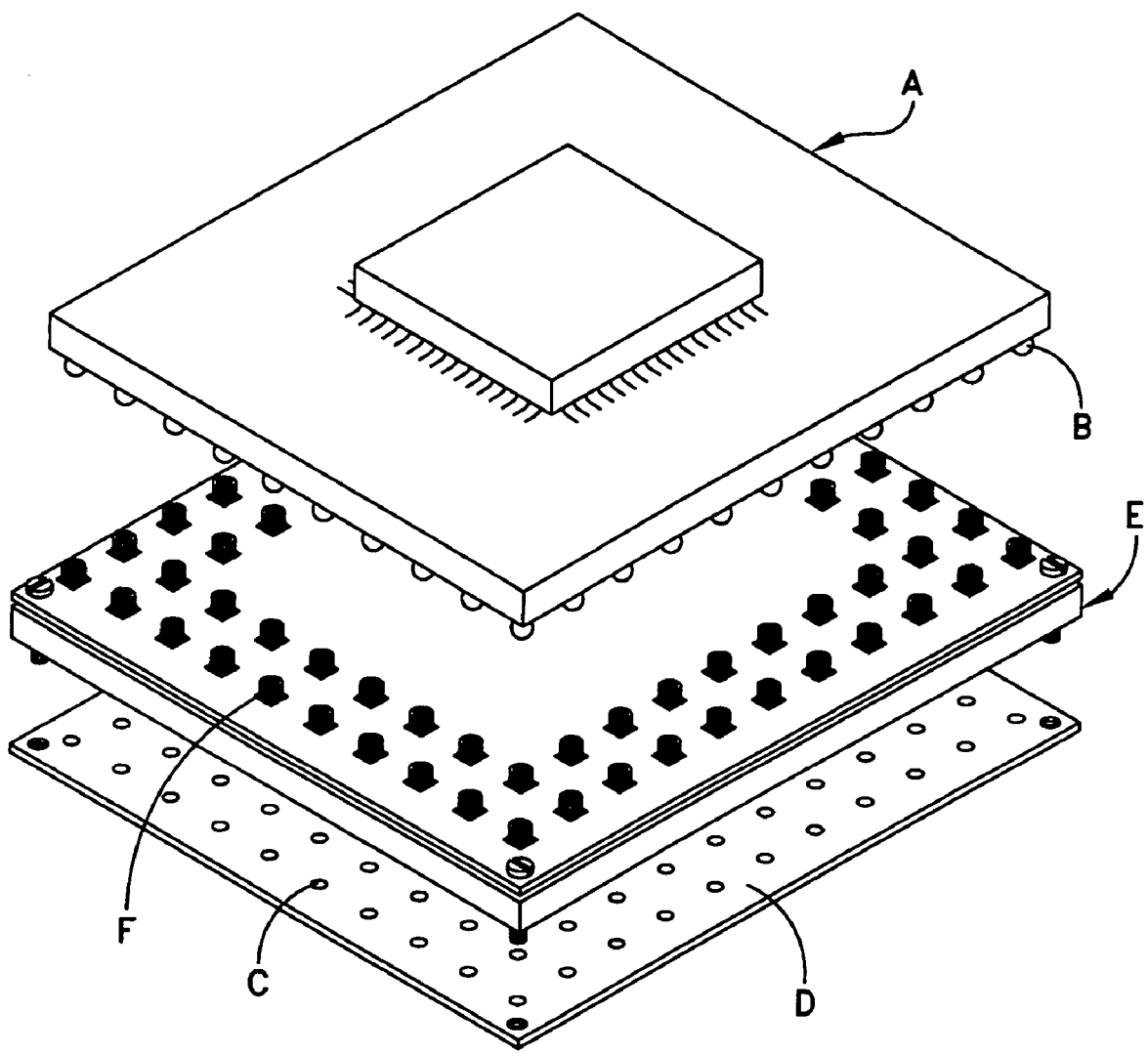
FIG. 1 is a perspective exploded view of a prior art land grid array assembly.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Referring to FIGS. 2–6, the present invention provides an electrical contact 2 that comprises a large elastic range as a result of being formed so as to comprise an interlaced or woven, annealed metal structure that provides a plurality of individual beam-sections 6. Electrical contact 2 may be formed by weaving at least three or four discrete wires 8 together, i.e., manipulating the wires together so as to interlace them to form a unitary structure, to thereby form an electrical contact precursor mesh 12 in either a tubular configuration (FIGS. 2–6 and 11–12) or a sheet (FIGS. 9–10 and 13–17). Advantageously, the tubular embodiments of the present invention do not require there to be a central support structure around which the wires are wound or, an outer or inner support structure within which the wires reside in a formed electrical contact configuration, since the combination of interlacing and annealing wires 8 removes the need for any additional integral or overplayed, co-extruded, or over-molded structural support. In other words, the electrical contacts can be operated for their intended purpose while simply comprising a mesh that has been manipulated to take a shape suitable for interconnecting two or more adjacent structures. It is in this sense then that electrical contacts 2 of the present invention are said to comprise an unsupported structure.

In one woven embodiment, eight stainless steel wires 8 are woven together to form a tubular electrical contact 2. In this arrangement, each wire 8 takes a helical path so as to be interlaced with each adjacent wire 8, while at the same time, each wire 8 only undergoes a substantially elastic deformation, i.e., each wire 8 would exhibit bending properties wholly consistent with the elastic limit portion of its underlying material's characteristic "stress-strain" or "force-deflection" curve. Substantially no plastic deformation is caused to occur in wires 8 during this manufacturing step. Also, it should be understood that at the points of intersection/overlap 9 of wires 8 in mesh 12, no bonding or other mechanical interconnection exists between the adjacent portions of wires 8. As a result of this structural arrangement, the adjacent portions of each wire 8 that define each of the intersection/overlap points 9 are movable relative to one another. It has been found to be effective, in braided or interlaced structures, that mechanical stability may be achieved when the ratio of the diameter of the contact and the lay length is smaller than about one-half, when cut into short segments even after annealing, where the lay length is the length per wire turn. Thus electrical contacts having a diameter greater than 10 mils may be manufactured with adequate results.

Figure 3:
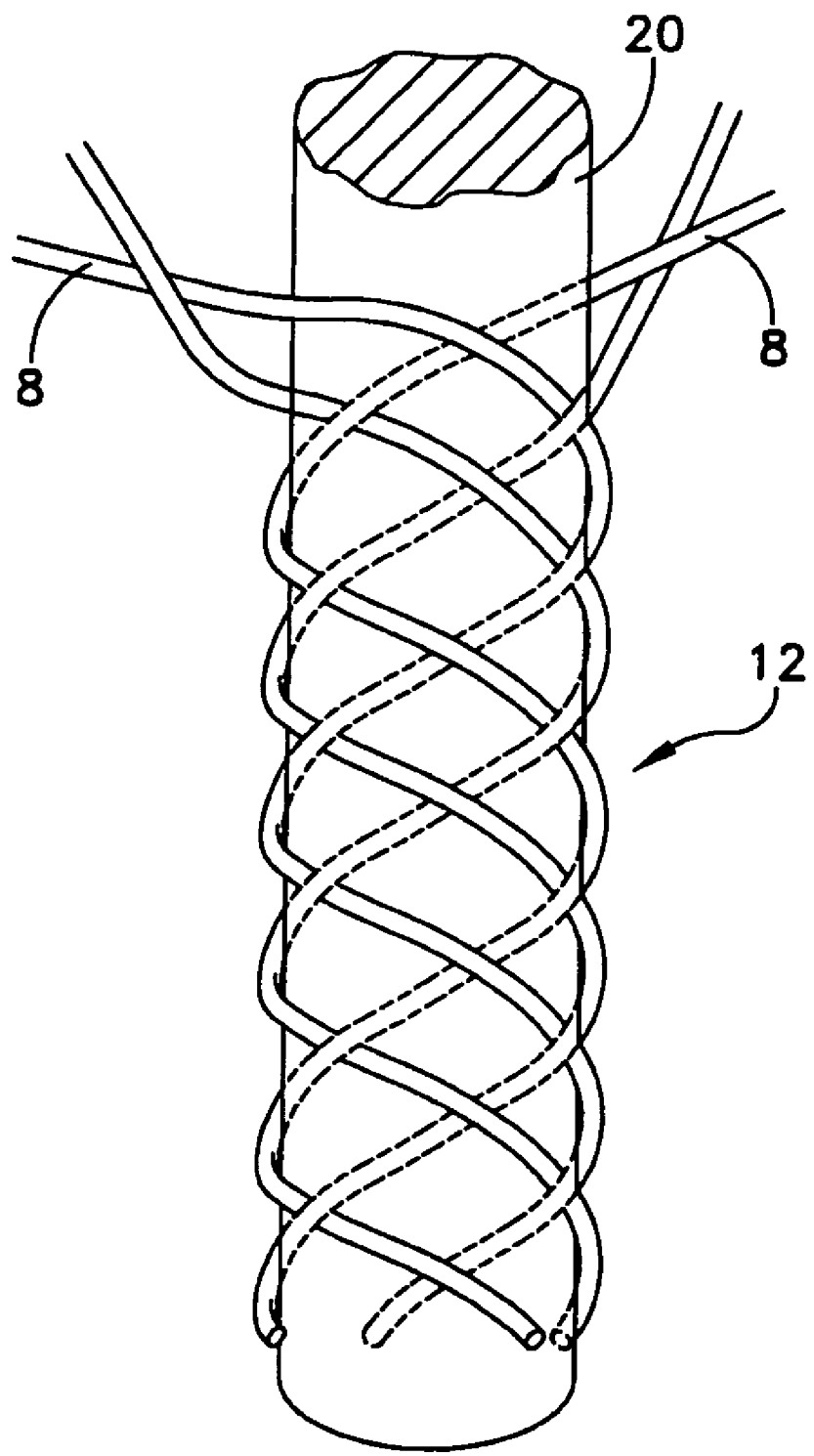
FIG. 3 is a perspective view, partially in phantom, illustrating the winding of individual wires about a central core during the manufacture of an electrical contact in accordance with the present invention.

Significantly, once woven the tubular electrical contact is annealed so as to stress relieve wires 8, particularly at the plurality of intersection/overlap points 9. Metals, such as stainless steel and copper, comprise a generally cubic crystal structure. It is the particular variation of this crystalline structure (face centered cubic) that gives these metals their ductility allowing for elastic bending of wires 8 into curved shapes, e.g., by winding or braiding about a removable mandrel 20 (FIG. 3). However in the present invention, wires 8 suffer no such defect dislocation or plastic deformation during weaving. Instead, annealing elastically deformed wires 8 in mesh 12 substantially eliminates the elastic strain stored within the wires so that slippage of the metal crystals occurs in a controlled manner. In this way, the metal is composed of regular crystals that have taken a set in their woven configuration by relieving the elastic strain induced in each wire by the interlacing or weaving process. Thus, instead of wires 8 springing apart when cut into individual electrical contacts 2, they tend to maintain their combined structural integrity, and remain woven together.

Typically, a conventional electrical contact structure is formed by deforming the metal into the plastic range to permanent set the desired form. Often it is not possible to reach the desired form in one forming step. Instead the deformation is carried out in sequential steps until the final form is obtained. Bending a wire may work harden it, which introduces defects, known as dislocations, into the structure. These defects interfere with further deformation and make the metal hard and strong so it is not easily re-bent, and also cause the metal to take a set once bent. The annealing process is significant in this invention as a means to produce electrical contact comprising spring structures having relatively small dimensions. The structure of the present invention is often of such a small dimension that it is difficult to use conventional bending and forming processes. If a tubular structure were to be formed by plastic deformation, the cross-section of the individual wires will also be severely deformed at the same time which is not desirable for mechanical performance.

Figure 11:
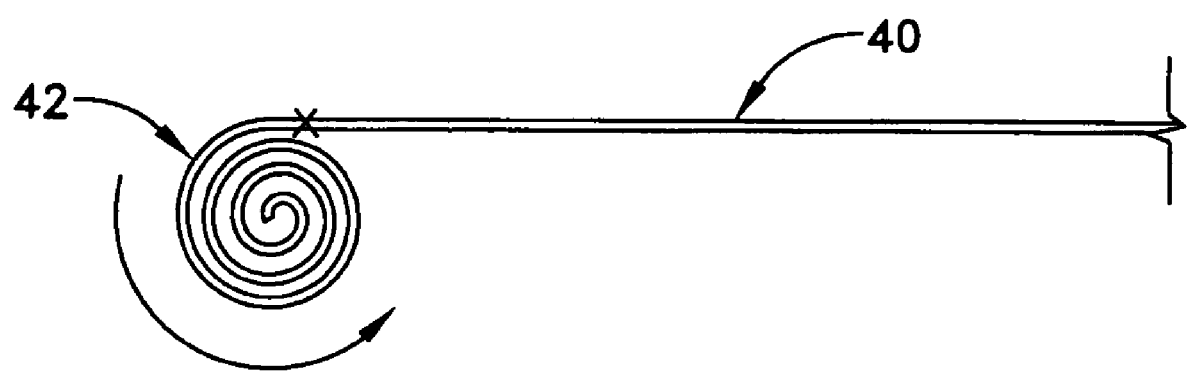
FIG. 11 is a top view of the mesh shown in FIG. 9, illustrating the process of being rolled into a tubular contact in accordance with the present invention.

In the present invention, the forming of the structure involves only essentially elastic deformation in rolling, braiding, and other processes. Under elastic deformation the formed structure cannot be maintained without a supporting constraint, otherwise the structure will fall apart as a result of elastic rebound. Advantageously, electrical contacts of the present invention may be formed by constraining them in a precursor form, then annealing them at a sufficiently high temperature together with the stored elastic stress, dislocations will be generated and moved to permanently set the shape of the electrical contact thus relaxing the stored elastic strain. The extent of deformation in the elastic range is limited so that the shape of the wire cross-section, for example, will not be altered and it will be easier to design the die or other means of constraint. A folded or pleated structure may be formed by annealing the structure, while still elastically deformed in a properly designed die or other fixture which serves as the constraint. For a rolled electrical contact structure, a properly designed constraint to maintain the tubular form is necessary during annealing. In one embodiment, mesh 12 is wrapped upon itself so as to form a plurality of overlapping layers providing a substantially helical structure to the tube (FIG. 11). In the case of a braided tubular structure, before cutting, the structure itself acts as a constraint during annealing.

The annealing of mesh 12 relieves the elastic strain that is inherent in wires 8 as a result of the weaving process, particularly at intersection/overlap points 9 where wires 8 are elastically deformed so as to bend or curve. Absent this annealing step and structure, wires 8 and mesh 12 would simply spring apart in the absence of any additional internal or external support structure affixed to mesh 12, e.g., a polymeric or elastomeric support core or shell. The combination of weaving individual wires 8 into a structure having inherent macro-elastic properties, with an annealing step to set the individual wires 8 in their woven structural arrangement, provides for significantly enlarged force deflection properties. Thus when woven into mesh 12 according to the invention, and then annealed, plurality of wires 8 provide a resilient electrical contact structure having a significantly increased elastic range. To maintain a good surface condition heat treatment should be carried out in a controlled atmosphere furnace at the appropriate temperature for the particular grade of stainless steel or, in a less preferred embodiment, alloy of copper which may also be oil quenched to achieve maximum hardness.

Figure 2:
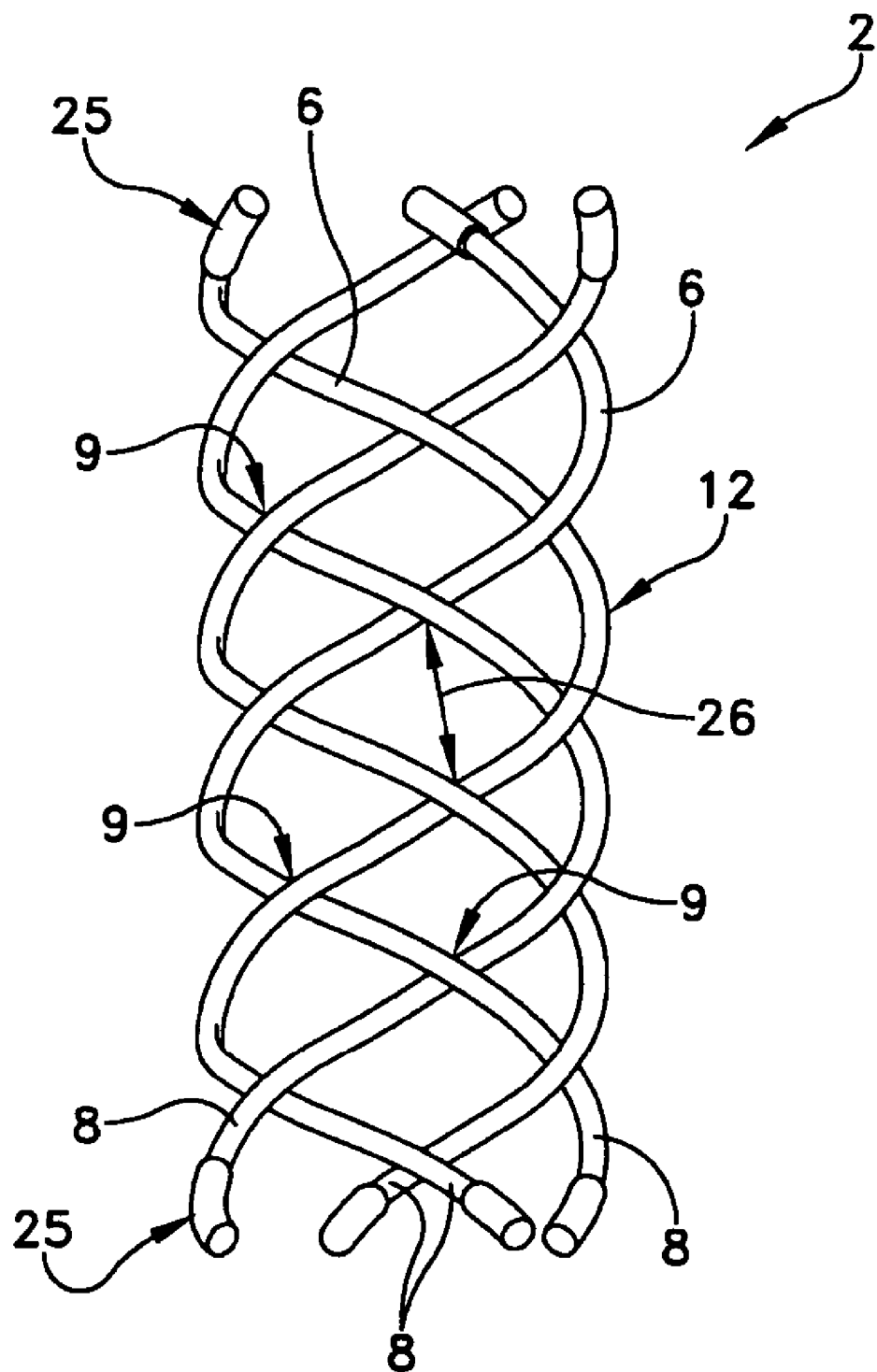
FIG. 2 is a perspective view of a woven electrical contact formed in accordance with one embodiment of the present invention.

According to the present invention, electrical contact 2 may be fabricated from three, four, or more loosely woven or braided conductive fibers or wires using, e.g., a conventional wire braiding machine (not shown). For example, wire braiding machines have long been used in industry to braid metallic or composite wire into electrical or electronic cable as an electromagnetic shield, or into hydraulic hose and cordage as a load bearing structure. One such braiding machine that is suitable for forming electrical contact 2 is a maypole type machine wherein carriers for bobbins carrying the individual wires 8 to be woven, are moved by horn gears or notched rotors on a deck with all of the carriers following alternating circular or arcuate paths around a braiding point. In the present invention, the braiding point may be disposed along a removable cylindrical mandrel 20, or some other removable center support (FIG. 2). Half the bobbin carriers travel in one direction around the braiding point (located along removable cylindrical mandrel 20) following one alternating path, while the other half of the carriers travel in the opposite direction around the braiding point following another alternating path which crosses the first path at each alternating direction. As the two sets of carriers travel in opposite directions around the braiding point, each crossing the path of the other, the wires leaving the bobbins are interwoven as they converge to the braiding point. A continuous tube of electrical contact precursor material is drawn from the conventional wire braiding machine. The electrical contact precursor is then annealed followed by processing through a cutting station where it is cut transversely into individual electrical contacts 2. Such machines are well known in the art, e.g., as disclosed in U.S. Pat. Nos. 3,783,736; 5,085,211; 5,257,571; and 5,931,077, which are all incorporated herein by reference.

Another type of braiding machine useful for forming electrical contact 2 is known as a rotary braiding machine (not shown). In these machines, there is a set of inner carriers, a set of outer carriers and a set of strand deflectors located between the inner and outer carriers. The inner and outer carriers are rotated so as to follow a circular path about the braiding point in opposite directions. The deflectors stand in the pathway of the strands from the outside carriers. These deflectors cause the wires from the outer carrier to cross the path of the inner carrier thus interweaving the wires. The interwoven wires then converge to the braiding point to form the woven electrical contact 2. Here again, a continuous tube of electrical contact precursor material is drawn from the rotary braiding machine, annealed, and then processed through a cutting station where it is cut transversely into individual electrical contacts 2. Such machines are also well known in the art, e.g., as disclosed in U.S. Pat. No. 4,275,638, which patent is incorporated herein by reference.

Suitable electrically-conductive fibers or wires include virtually any fiber material having a bulk resistivity below about 100 $\mu\Omega/cm$, and preferably about 2 to 5 $\mu\Omega/cm$. Typically, the electrically-conductive fibers will be conductive metal wires, such as, tungsten and its alloys, stainless steel or alloys of copper, that may have portions coated with highly conductive metals (identified by reference numeral 25 in FIG. 2), such as, silver, palladium, rhodium, gold, and the various alloys thereof. Alternatively, suitable electrically conductive fibers can be prepared by modifying electrically insulating fibers, such as by introducing a conductivity-imparting agent such as metal particles to a natural or synthetic polymer or other material, such as carbon. While polymer composites may not be able to withstand typical annealing temperature, a ceramic/metal composite may be used with good effect.

Figure 7:
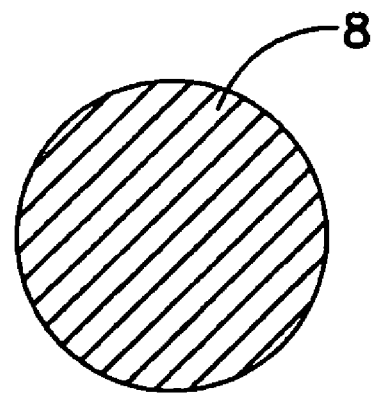
FIG. 7 is a cross-sectional view of a wire of the type used in forming the electrical contact of the present invention.
Figure 8:
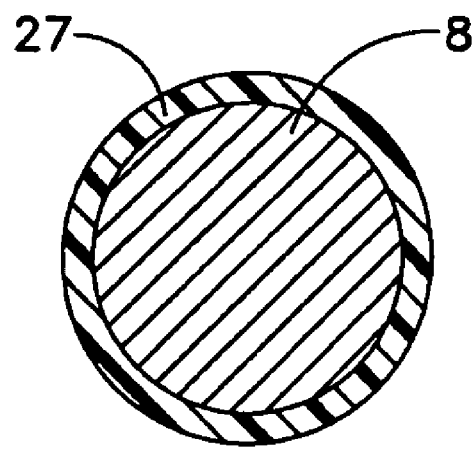
FIG. 8 is a cross-sectional view, similar to FIG. 7, but showing an insulating layer placed on the outer surface of wire.
Figure 9:
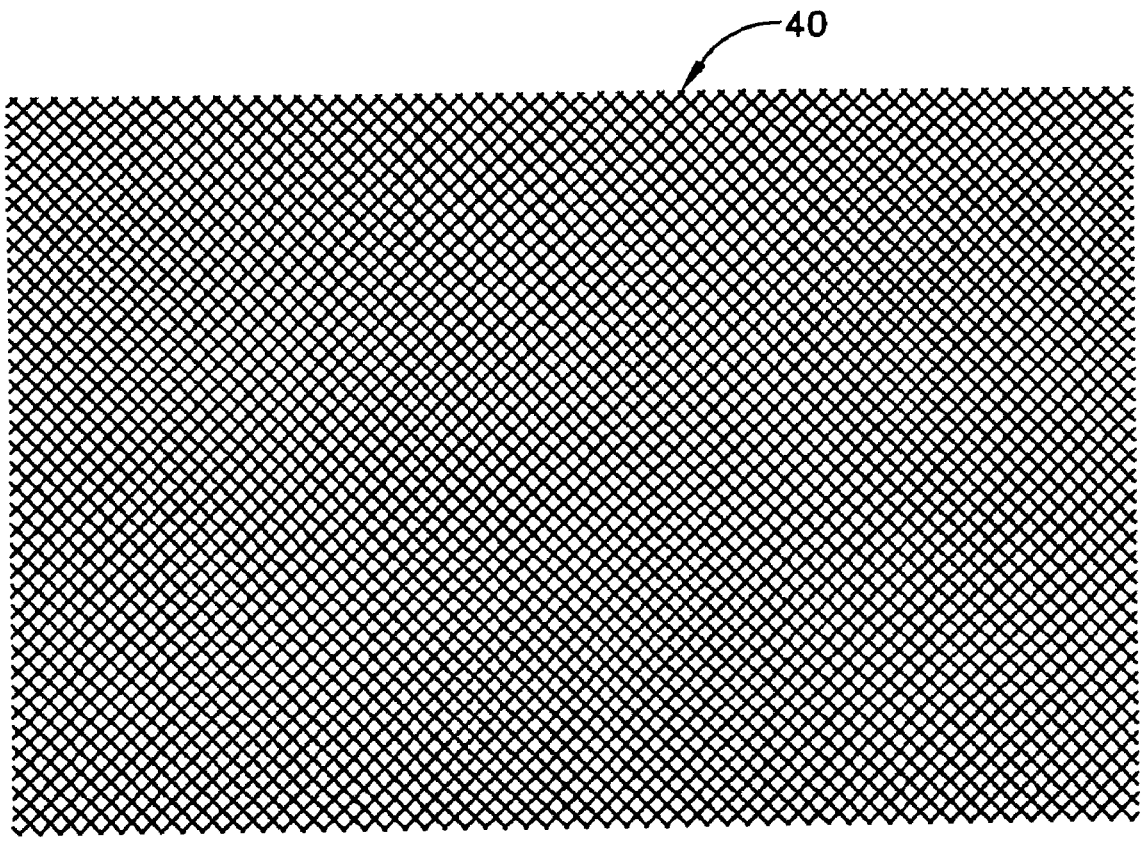
FIG. 9 is a top elevational view of an embodiment of wire mesh used to form an electrical contact in accordance with an alternative embodiment of the present invention.
Figure 10:
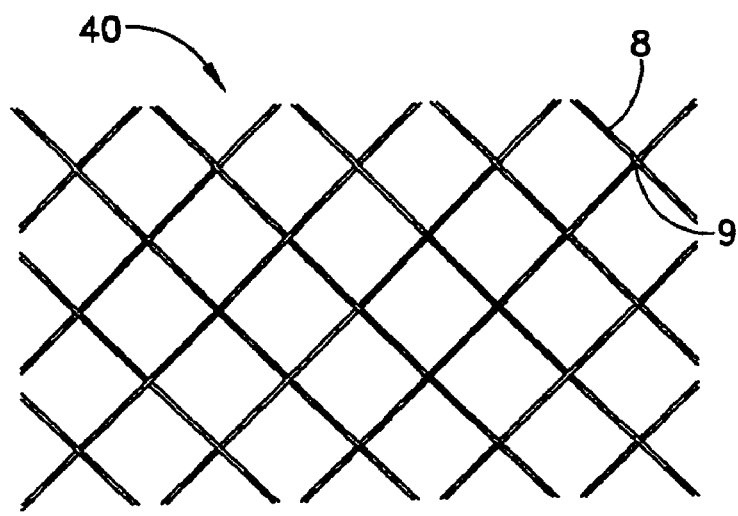
FIG. 10 is a magnified view of the mesh shown in FIG. 9.

Typically, electrically-conductive wires suitable for use in the present invention will have a diameter in the range from about 0.025 to 0.1 millimeters. The spacing between adjacent conductors (identified by reference numeral 26 in FIG. 2) are typically in the range from about 0.1 to 0.5 millimeters as measured between opposing wire intersection points 9. Referring to FIGS. 7 and 8, wires 8 may either be bare or have an insulation coating 27 applied to their outer surface. In all cases, the weave should be sufficiently loose, with gaps or interstices remaining between adjacent wires 8 so that during longitudinally applied compression, wires 8 form a plurality of elastically deformable beam-sections 6 so as to provide a required spring force. Advantageously, electrical contact 2 is subjected to an annealing process so as to substantially set each individual wire 8 in its bent or curved shape and as a structural element or constituent of woven mesh 12. Annealing for a stainless steel wire is conducted at temperatures ranging from about 500° C. to about 600° C., with about 550° C. being preferred for most applications.

Figure 4:
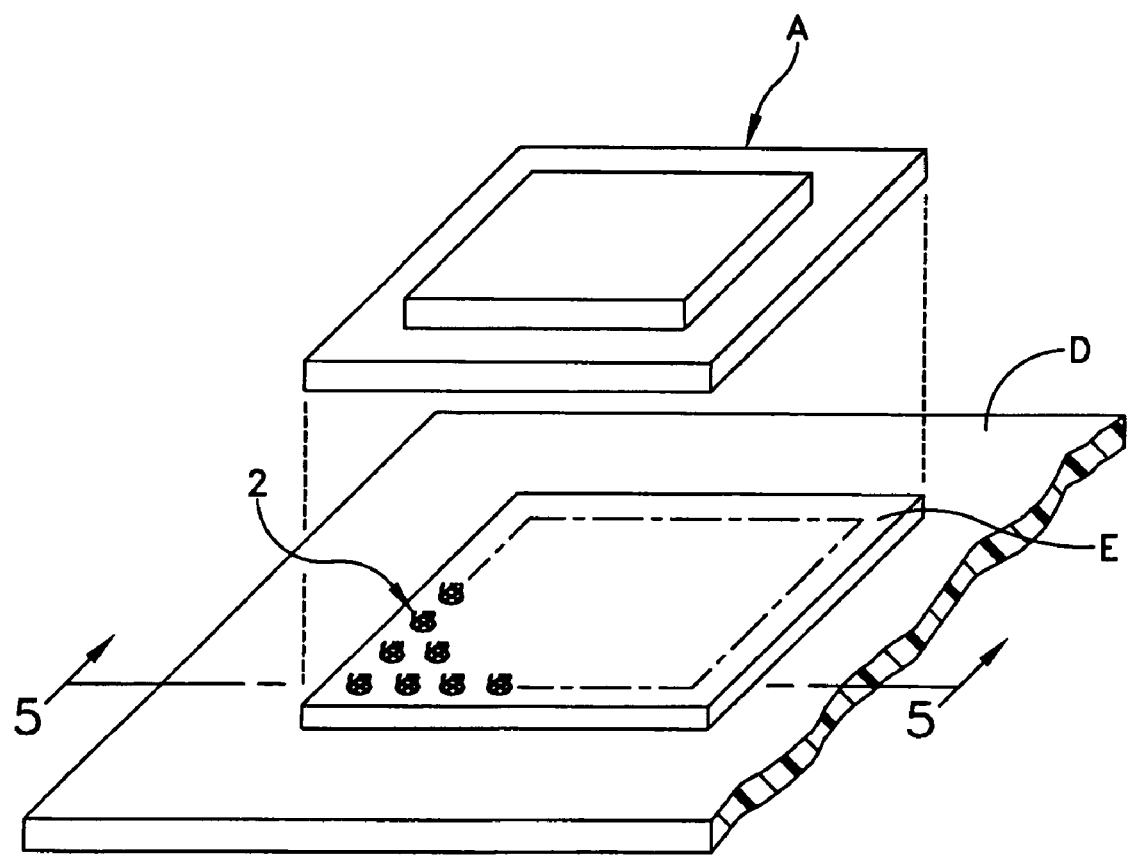
FIG. 4 is a perspective view of a land grid array assembly, similar to that shown in FIG. 1, but incorporating electrical contacts formed in accordance with the present invention.
Figure 5:
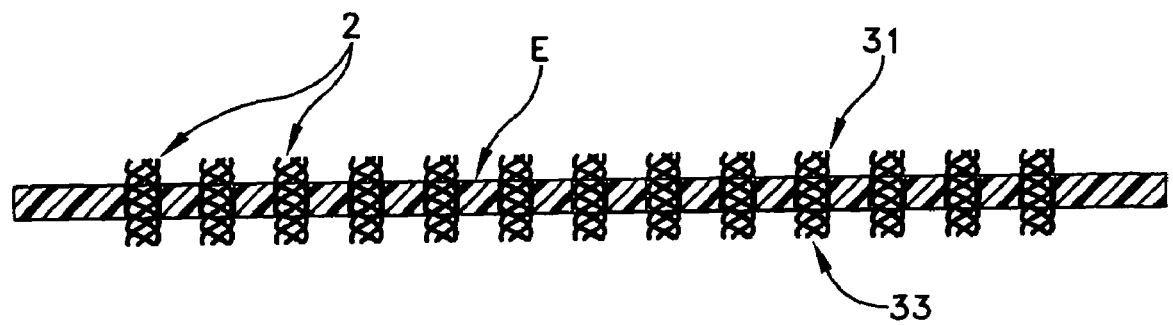
FIG. 5 is a cross-sectional view of the land grid array assembly shown in FIG. 4.
Figure 6:
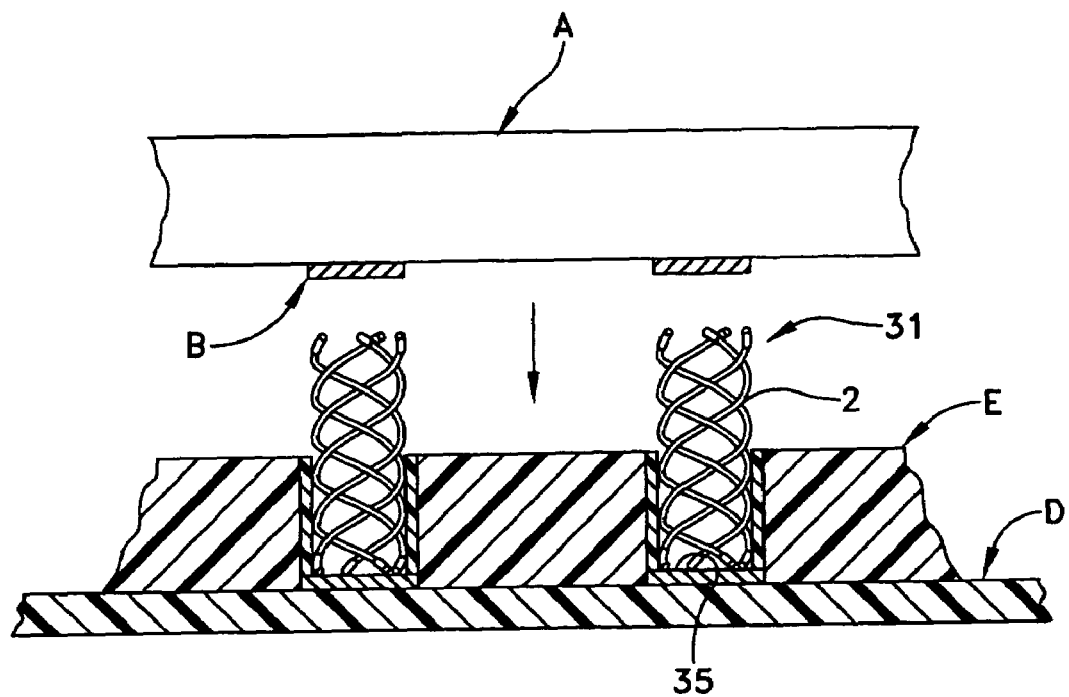
FIG. 6 is a side cross-sectional view, partially broken-way, of the land grid array assembly shown in FIG. 4.

Referring to FIGS. 4, 5, and 6 an IC package A may be electrically connected to trace circuits on PCB D using an LGA assembly comprising electrical contacts 2 in accordance with the present invention. Each electrical contact 2 is positioned within a passageway formed in housing E such that a first end 31 of each electrical contact 2 is positioned above a surface of housing E, and a second end 33 is positioned below a surface of housing E (FIG. 5). Alternatively, a housing having a plurality of blind openings 35 arranged in an array that corresponds with the array of contact pads B on IC package A such that an inner connection can be made between IC package A and circuit traces located on or in PCB D.

Figure 12:
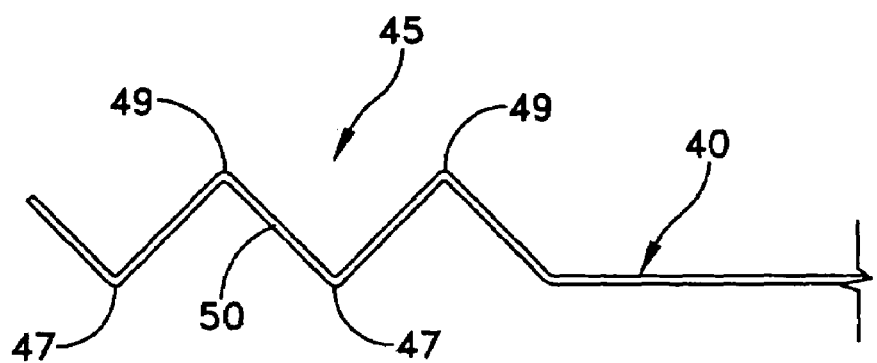
FIG. 12 is a top end view of a portion of the mesh shown in FIG. 9, after pleating so as to form yet another embodiment of the present invention.
Figure 13:
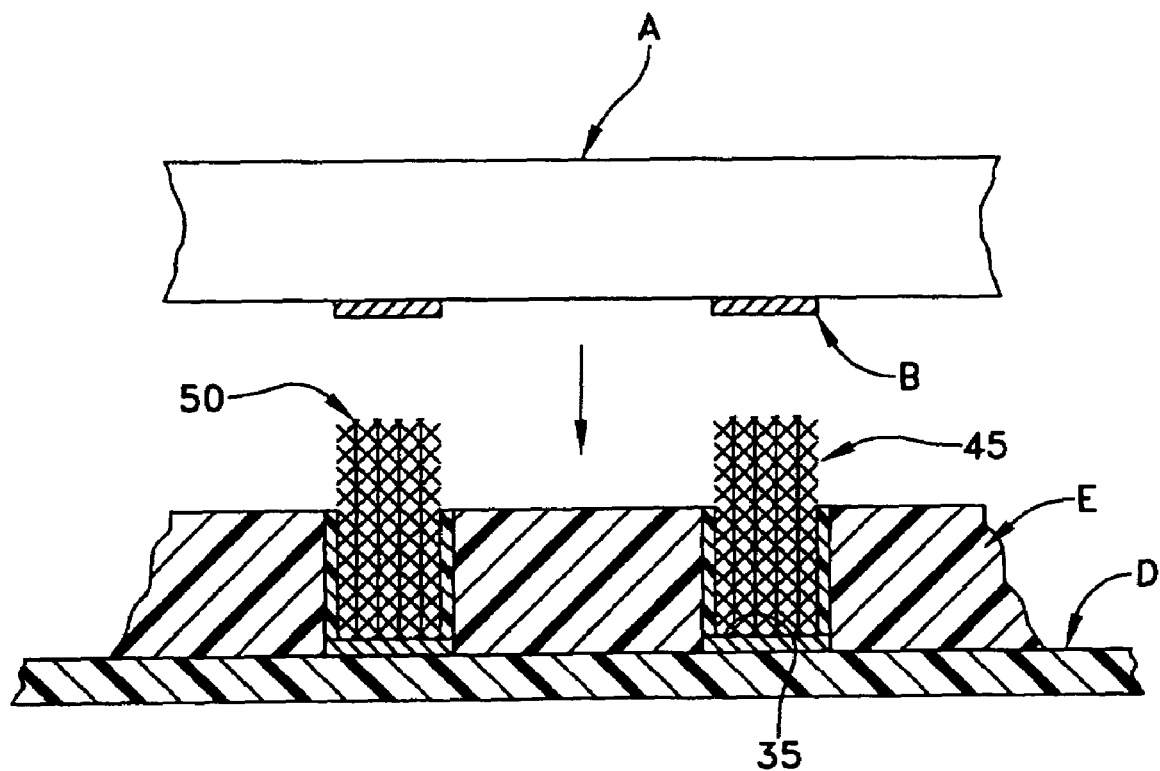
FIG. 13 is a broken-way, cross-sectional view of a land grid array assembly, similar to that shown in FIG. 6, but incorporating a pleated mesh electrical contact.
Figure 14:
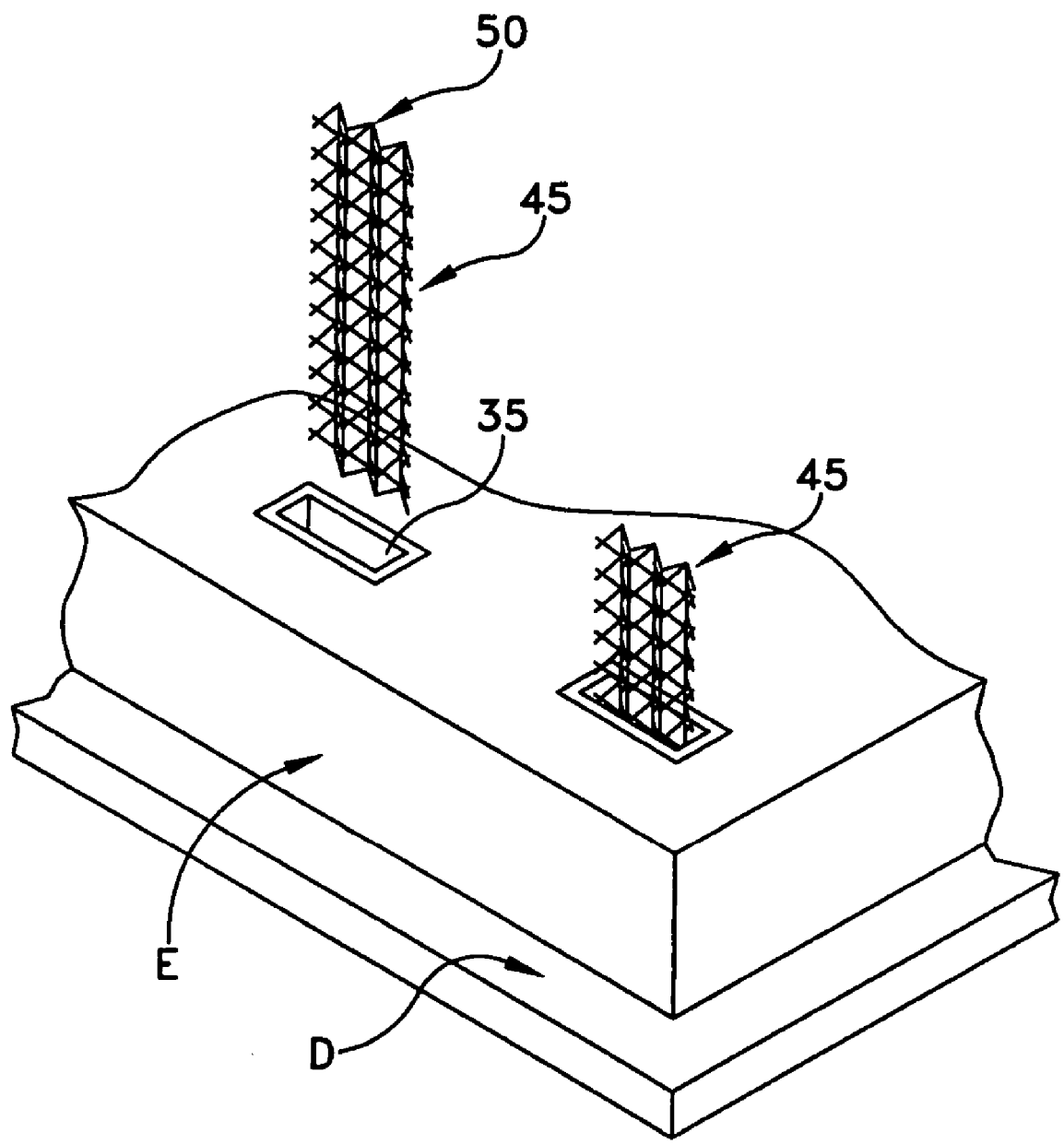
FIG. 14 is a broken-away, perspective view of an interconnection system incorporating individual pleated electrical contacts formed in accordance with the present invention.

In one alternative embodiment of the invention, wires 8 may be woven into an initially flat mesh 40 (comprising warp and weft wires) which then may be formed so as to create a variety of contact structures. For example, mesh 40 may be rolled upon itself so as to form a rolled contact 42 (FIGS. 11 and 12). Mesh 40 is wrapped upon itself so as to form a plurality of overlapping layers providing a substantially helical structure to rolled contact 42 (FIG. 11). Each rolled contact 42 may then be cut from mesh 40 and assembled within a suitable housing as disclosed hereinabove. Alternatively, mesh 40 may be folded so as to create a plurality of pleats 45 defined by a plurality of troughs 47 and ridges 49. A contact edge 50 is defined along the perimeter of pleats 45. Pleated electrical contacts 45 may then be cut from mesh 40 and positioned within a plurality of passageways or openings 35 within housing E such that contact edge 50 is positioned in spaced confronting relation to contact pads B (FIG. 14). In this way, pleats 45 act to support the contact within openings 35. In operation, as IC package A is moved toward housing E, contact pads B engage contact edge 50 of pleated electrical contact 45 thereby deforming pleated electrical contact 45 to produce a resultant contact force. Here again, annealing pleated contact 45 or rolled contact 42 allows for a set to be created in wires 8. In the case of pleated electrical contacts 50, a suitable forming tool, having a pleated punch and die set, may be closed on mesh 40 during the annealing process in order to maintain the structural arrangement in elastically formed wires 8.

Figure 15:
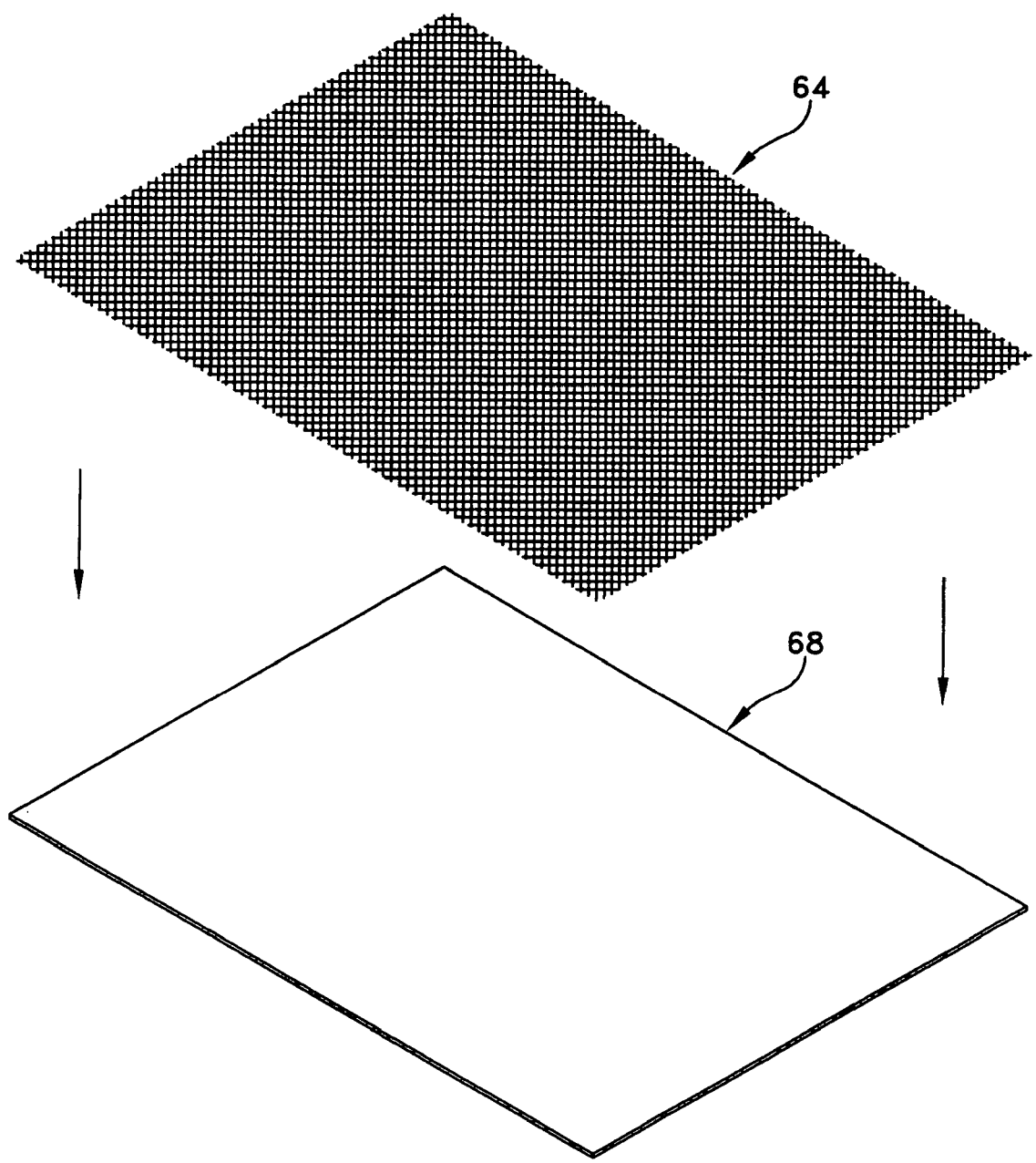
FIG. 15 is an exploded perspective view of a photo-mask being applied to a sheet of conductive metal so as to form a mesh in accordance with yet a further embodiment of the invention
Figure 16:
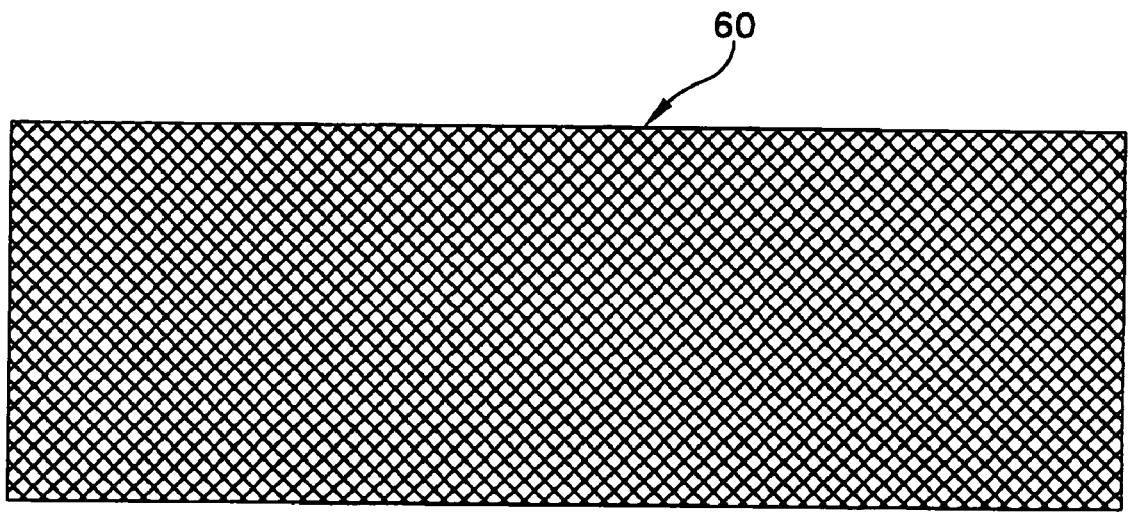
FIG. 16 is a photo-etched mesh forming a sheet similar to that shown in FIG. 9, but produced through a photo-etching process.
Figure 17:
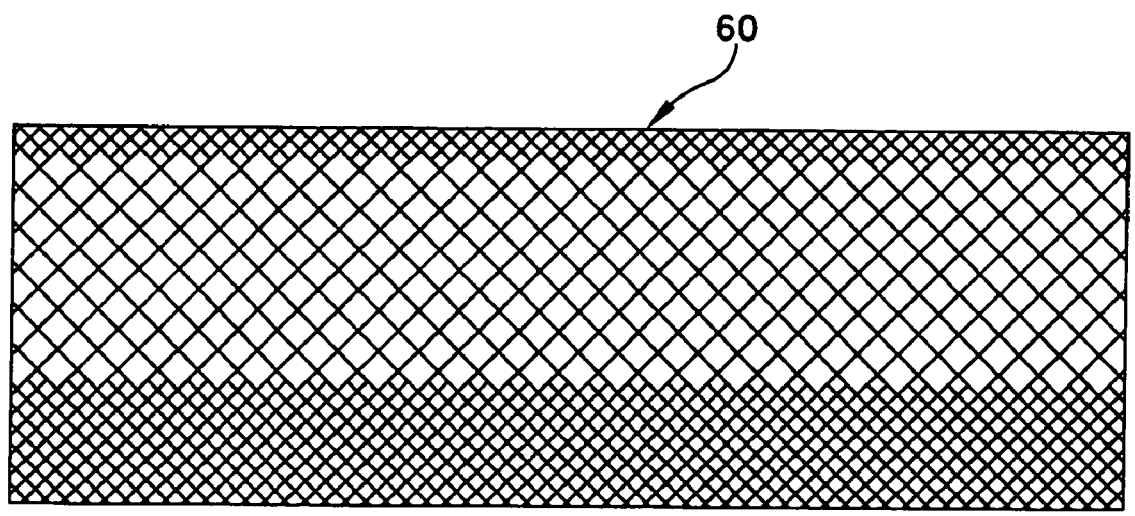
FIG. 17 is an alternative photo-etched mesh forming a sheet similar to that shown in FIGS. 9 and 16, but showing a pattern of varying width openings between beam intersection points.

In yet a further alternative embodiment, a mesh 60 may be formed through a photo-etching process in which a mask 64 is applied to a sheet of conductive material, e.g., stainless steel 68, and photo-etched in accordance with the conventional method (FIG. 15). The resulting flat mesh 60 comprising an array of intersecting beams defining an array of openings therebetween may then be rolled or pleated as disclosed hereinabove (FIGS. 16 and 17). Once again, photo-etched mesh 60 must be annealed after either rolling or pleating in order to substantially eliminate the elastic strain stored within photo-etched mesh 60 so that slippage of the metal crystals occurs in a controlled manner. In this way, the metal is composed of regular crystals that have taken a set in their photo-etched and either rolled or pleated configuration. The compliance of the etched mesh structure will depend upon several factors, including its cross-sectional dimensions, as well as, the ratio of the height and width of the mesh opening, e.g., an array of rhomboidally shaped openings. A mesh 60 may be formed with an array of diamond shaped openings having varying ratios of the height and width of the mesh opening (FIG. 17). The smaller the ratio, the higher will be the compliance at low applied force. In contrast, the weaved or braided electrical contact structure of the present invention will have movable joints and the compliance will depend on the wire diameter and the ratio of the diameter of the contact and the lay length. Of course, a mesh sheet can be formed in accordance with the present invention by casting, vapor deposition or other positive (additive) metal deposition processes.

It is to be understood that the present invention is by no means limited only to the particular constructions herein disclosed and shown in the drawings, but also comprises any modifications or equivalents within the scope of the claims.

What is claimed is:

1. An electrical contact for electrically engaging first and second confronting conductive pads comprising a plurality of interlaced, annealed, and unsupported wires comprising at least three discrete wires that have been manipulated together so as to interlace them to form a unitary open-ended tubular structure that is substantially free of elastic strain while in the form of said unsupported, open-ended tubular structure, having a first circumferential contact edge that is (i) formed by a first free end of each of said at least three discrete wires, and (ii) engapeble by axial compression of said electrical contact, and a second circumferential contact edge spaced axially from said first circumferential contact edge that is (iii) formed by a second free end of each of said at least three discrete wires, and (iv) engagable by said axial compression of said electrical contact.

2. An electrical contact according to claim 1 wherein said plurality of interlaced and annealed wires comprise a woven and annealed structure that provides a plurality of individual beam-sections.

3. An electrical contact according to claim 1 wherein said plurality of interlaced and annealed wires comprise at least three discrete wires that have been manipulated together so as to interlace them to form said unitary tube that is substantially free of elastic strain, wherein said unitary tube may be axially, compressively loaded in the absence of an extruded resiliently supporting structure during said axial compression.

4. An electrical contact according to claim 1 wherein said plurality of interlaced and annealed wires comprise three discrete wires that have been manipulated together so as to interlace them to form a unitary tubular structure in the absence of at least one of a central support structure around which said wires are wound and an enclosing and substantially encasing support structure.

5. An electrical contact according to claim 1 wherein said plurality of interlaced and annealed wires comprise at least three discrete wires that have been manipulated together so as to interlace them to form a unitary tubular structure without at least one of an outer and inner support structure.

6. A connector system comprising, in combination:
a housing defining a plurality of openings each having a first open end and a second open end; and
an electrical contact comprising a plurality of interlaced, annealed and unsupported wires disposed in each of said openings wherein said plurality of interlaced and annealed wires comprise at least three discrete wires that have been manipulated together so as to interlace them to form a unitary open-ended tubular structure having a top conducting edge that provides at least three contact points each formed by a first free end of one of said at least three discrete wires and projecting outwardly from said first open end for electrical engagement with a first one of said confronting conductive pads by axial compression of said electrical contact and a bottom conducting edge that provides at least three contact points each formed by a second free end of one of said at least three discrete wires projecting outwardly from said second open end for electrical engagement with a second one of said confronting conductive pads by axial compression of said electrical contact so as to provide an electrical pathway that is substantially free of elastic strain while in the form of said unsupported, open-ended tubular structure.

* * * * *